(12) United States Patent
De Bosscher et al.

(10) Patent No.: US 12,080,527 B2
(45) Date of Patent: Sep. 3, 2024

(54) MOVEMENT SYSTEMS FOR SPUTTER COATING OF NON-FLAT SUBSTRATES

(71) Applicant: SOLERAS ADVANCED COATINGS BV, Deinze (BE)

(72) Inventors: Wilmert De Bosscher, Drongen (BE); Ivan Van De Putte, Waregem (BE); Niek Dewilde, Kruishoutem (BE)

(73) Assignee: SOLERAS ADVANCED COATINGS BV, Deinze (BE)

( * ) Notice: Subject to any disclaimer, the term of this patent is extended or adjusted under 35 U.S.C. 154(b) by 211 days.

(21) Appl. No.: 17/626,244

(22) PCT Filed: Jul. 14, 2020

(86) PCT No.: PCT/EP2020/069854
§ 371 (c)(1),
(2) Date: Jan. 11, 2022

(87) PCT Pub. No.: WO2021/009158
PCT Pub. Date: Jan. 21, 2021

(65) Prior Publication Data
US 2022/0254613 A1     Aug. 11, 2022

(30) Foreign Application Priority Data
Jul. 14, 2019   (BE) .................. 2019/5454

(51) Int. Cl.
*H01J 37/32*      (2006.01)
*C23C 14/34*     (2006.01)
(Continued)

(52) U.S. Cl.
CPC .... *H01J 37/32752* (2013.01); *C23C 14/3407* (2013.01); *C23C 14/35* (2013.01);
(Continued)

(58) Field of Classification Search
None
See application file for complete search history.

(56) References Cited

U.S. PATENT DOCUMENTS 7,563,725 B2   7/2009   Morad
8,580,037 B2   11/2013  Morad
(Continued)

FOREIGN PATENT DOCUMENTS

CN   101681844 A   3/2010
CN   104160471 A   11/2014
(Continued)

OTHER PUBLICATIONS

Russian Office Action from Corresponding Russian Patent Application No. RU2022102335, Aug. 22, 2023.
(Continued)

*Primary Examiner* — Jason Berman
(74) *Attorney, Agent, or Firm* — Workman Nydegger (57) ABSTRACT

A movement system is provided for moving a non-flat substrate across a sputter flux distribution without circumferentially exposing the non-flat substrate to the sputter flux distribution. The movement system is arranged for a first movement of translationally transporting the non-flat substrate along the sputter flux distribution, and a second movement of translating and/or rotating the non-flat substrate with respect to the sputter flux distribution.

17 Claims, 4 Drawing Sheets

(51) Int. Cl.
 *C23C 14/35* (2006.01)
 *C23C 14/50* (2006.01)
 *H01J 37/34* (2006.01)

(52) U.S. Cl.
 CPC ............ *C23C 14/50* (2013.01); *C23C 14/505* (2013.01); *H01J 37/3405* (2013.01); *H01J 37/347* (2013.01); *H01J 2237/20214* (2013.01); *H01J 2237/20221* (2013.01); *H01J 2237/3323* (2013.01)

(56) References Cited

U.S. PATENT DOCUMENTS

| | | |
|---|---|---|
| 10,424,468 B2 | 9/2019 | De Bosscher et al. |
| 10,683,777 B2 | 6/2020 | Henry et al. |
| 2008/0152799 A1 | 6/2008 | Jou |
| 2008/0248647 A1 | 10/2008 | Morad |
| 2008/0289957 A1 | 11/2008 | Takigawa et al. |
| 2009/0255471 A1 | 10/2009 | Morad |
| 2011/0076422 A1 | 3/2011 | Stowell |
| 2016/0189939 A1 | 6/2016 | Deppisch et al. |
| 2017/0138224 A1* | 5/2017 | Henry .................. F16H 53/025 |
| 2017/0207071 A1 | 7/2017 | De Bosscher et al. |
| 2017/0298783 A9 | 10/2017 | Henry et al. |
| 2019/0276929 A1* | 9/2019 | Mebarki ........... H01L 21/02266 |

FOREIGN PATENT DOCUMENTS

| | | |
|---|---|---|
| CN | 106488996 A | 3/2017 |
| CN | 106795617 A | 5/2017 |
| JP | 2002285332 A | 10/2002 |
| JP | 2004084022 A | 3/2004 |
| JP | 2006083408 A | 3/2006 |
| JP | 2008019497 A | 1/2008 |
| RU | 2437964 C2 | 12/2011 |
| RU | 2539487 C2 | 1/2015 |
| TW | 201129713 A | 9/2011 |
| WO | 2009039261 A1 | 3/2009 |
| WO | 2016005476 A1 | 1/2016 |

OTHER PUBLICATIONS

Search Report and Written Opinion from corresponding Belgian Application No. 201905454, Mar. 27, 2020.
International Search Report and Written Opinion from PCT Application No. PCT/EP2020/069854, Oct. 12, 2020.
Chinese Office Action from corresponding CN Application No. 202080046915, Sep. 16, 2023.
Taiwanese Search Report from corresponding TW Application No. 109123708, Oct. 17, 2023.
Japanese Office Action from corresponding JP Application No. 2022-502082, Mar. 29, 2024.
Chinese Office Action from corresponding CN Application No. 202080046915.X, May 9, 2024.

* cited by examiner

MOVEMENT SYSTEMS FOR SPUTTER COATING OF NON-FLAT SUBSTRATES

TECHNICAL FIELD OF THE INVENTION

The present invention relates to substrate movement systems for sputter coating devices and more in particular to such movement systems configured for non-circumferential coating of non-flat substrates.

BACKGROUND OF THE INVENTION

Different kinds of sputter coating devices are known which allow to circumferentially coat a non-flat article. For example, batch coaters exist which feature a multilevel carrousel movement of the articles to be coated, so as to provide a relatively uniform circumferential coating thereon; such batch coaters are for example often used for coating various tools, such as drills and bits. Another known example is that of in-line coaters for coating tubes, wherein the tubes are rotated about their longitudinal axis while being transported along the coating zone.

Sputter coating devices for non-circumferentially coating a flat substrate (or which do not account for the non-flat shape of a substrate) are also known. These include for example batch or in-line coaters which are suited for coating a single face of articles such as mirrors or lenses. In some of these batch coaters, particularly when the coating source is relatively small, the articles can be fixed on a rotating dome so as to average out local variations in the sputter flux distribution and thus improve the uniformity of the obtained coating. In some cases, a surface of these articles which is not to be coated does come to face the coating source during such a movement (i.e. it is not directed away from said source at all times). Instead, non-circumferential coating is therein achieved by a masking effect through the way the articles are mounted with respect to a support (e.g. a substrate carrier) and/or with respect to each other. Examples thereof are for instance found in US2008152799A1 and US2017298783A9.

US2008152799A1 describes a batch coater in which a coating apparatus rotates about a central axis while a coating unit synchronously rotates upon itself, thereby producing a multiple-axis rotation for a lens clamped and fixed to the coating unit.

US2017298783A9 discloses the coating of individual cams—for assembling on a camshaft—with a hard diamond-like carbon (DLC) coating. The method involves disposing the cams on a support, bringing the support and the cams into a chamber placed under vacuum so as to clean the cams, bringing the support (by rotation or translation) into relative movement along a trajectory of travel relative to a coating source, and taking the cams off the support before assembling them on a camshaft. More specifically, the method involves disposing the cams on the support in a fixed configuration which is defined in such a way that the cams are brought successively opposite the source with orientations and at distances substantially identical relative to the source, to deposit the DLC coating selectively on the fraction of the section of the cams that is oriented towards the source.

However, for various applications, there is a growing demand for sputter coating devices which can form highly uniform non-circumferential coatings on non-flat substrates. Examples include coating one face of a shaped glass substrate (e.g. a windshield for a vehicle), or coating the exterior of a cover or housing (e.g. for an electronic device, such as a smartwatch or cell phone, or an electronic component, such as a chip or sensor). Here, the non-flat shape of the substrate is typically such that the desired uniformity cannot be achieved if said shape is ignored; such a highly uniform non-circumferential coating on a non-flat substrate can therefore not be realized using the above-described sputter coating devices. Indeed, the achievable uniformity of the coating in these sputter coating devices is limited and governed by the non-flat shape of the substrate. For example, in some embodiments of US2017298783A9 the coating was found to have a thickness that did not vary by more than ±20% for a subfraction of the surface exposed to the coating source. The solution proposed then to keep the whole coating within this thickness range—should that appear desirable—was to use masks to delimit the exposed surface to that subfraction. However, it goes without saying that simply restricting the coating to those fractions of the surface where a desired uniformity can be achieved is often not a viable approach, since other areas typically also need to be coated.

WO2016005476 describes a sputter device with a moving cylindrical target, where the substrate may be curved and the cylindrical target can be moved so as to follow this curvature, thereby allowing to meet the above-mentioned demand to some extent. However, sputtering typically takes place in a high-quality vacuum chamber, maintenance of which becomes exceedingly demanding as the volume of the chamber grows. Moreover, the sputter system comprising the cylindrical target and connected magnetron requires power and cooling connections with high specifications. Necessitating these to be flexible and support free movement of the sputter system further increases the already stringent requirements therefor, while simultaneously adding potential sources for vacuum leaks. As such, it is non-trivial to create a sputter device in which the sputter system can move sufficiently freely, while not disrupting the vacuum, to accommodate complex non-flat substrates.

There is thus still a need in the art for coating systems which address some or all of the issues outlined above.

SUMMARY OF THE INVENTION

It is an object of the present invention to provide good systems and devices for non-circumferential coating of non-flat substrates. It is a further object of the present invention to provide good practices associated therewith. This objective is accomplished by movement systems, coating devices, methods and uses according to the present invention.

In a first aspect, the present invention relates to a movement system for moving a non-flat substrate across a sputter flux distribution without circumferentially exposing the non-flat substrate to said sputter flux distribution. The movement system comprises movement means for: a first movement of translationally transporting the non-flat substrate along the sputter flux distribution, and an additional second movement of translating and/or rotating the non-flat substrate with respect to the sputter flux distribution.

It is an advantage of embodiments of the present invention that non-flat substrates can be subjected to an additional movement, beyond the standard translational transportation movement.

It is an advantage of embodiments of the present invention that the sputter flux incidence on the non-flat substrate can be controlled in function of the shape of the non-flat substrate.

It is an advantage of embodiments of the present invention that uniform non-circumferential coatings can be obtained on non-flat substrates. Under 'uniform non-circumferential coating' is herein understood that the coating is provided in a non-circumferential manner (i.e. a coating which does not wrap around all surfaces of the non-flat substrate), while nevertheless being relatively uniform where it is provided.

In embodiments, the movement system may comprise a substrate carrier for holding the non-flat substrate.

It is an advantage of embodiments of the present invention that the non-flat substrate can be held in a substrate carrier, which can facilitate handling of the non-flat substrate.

In embodiments, the movement means may comprise a guiding system for the non-flat substrate.

In embodiments, the movement means may comprise an actuator.

In embodiments, the actuator may be a multi-axis actuator.

It is an advantage of embodiments of the present invention that various types of movement means can be used.

It is an advantage of embodiments of the present invention that various types of non-flat substrates can be coated.

It is an advantage of embodiments of the present invention that various types of coatings can be applied.

In a second aspect, the present invention relates to a coating device for non-circumferential coating of a non-flat substrate. The coating devices comprises: (i) a sputter system, comprising at least one magnetron for mounting a longitudinal sputter target, and (ii) a movement system as defined in any embodiment of the first aspect.

It is an advantage of embodiments of the present invention that the sputter system can be kept in a fixed position or that adjustment thereof can be kept to a minimum.

In embodiments, the magnetron may be configured for mounting a cylindrical sputter target.

In embodiments, the sputter system may comprise at least two magnetrons.

It is an advantage of embodiments of the present invention that commercially available sputter systems can be used for coating non-flat substrates.

In embodiments, furthermore the sputter system may be configured for, in operation, adjusting a sputter flux distribution thereof with respect to the non-flat substrate. This can for example be realized by adjusting the magnetic system of the sputter system; e.g. by tuning the local magnetic field strength or e.g. by adjusting the orientation of the magnetic system inside a cylindrical target tube.

In embodiments, the coating device may be a continuous or in-line coating device.

In a third aspect, the present invention relates to a method for non-circumferentially coating a non-flat substrate. The method comprises: (a) providing a coating device as defined in any embodiment of the second aspect, and (b) moving the non-flat substrate along the sputter system while sputtering a coating thereon; wherein the moving comprises: (b1) translationally transporting the non-flat substrate along the sputter system, and (b2) additionally translating and/or rotating the non-flat substrate with respect to the sputter system.

In embodiments, translating and/or rotating the non-flat substrate in step b2 may be in function of a shape of the non-flat substrate.

In embodiments, rotating the non-flat substrate in step b2 may comprise at least one rotation component over a rotation angle larger than 0° and smaller than 360°.

In a fourth aspect, the present invention relates to a use of a coating device according to any embodiment of the second aspect for providing a uniform coating on at least one major surface of a non-flat substrate, selectively with respect to at least one other major surface thereof.

In embodiments, a local layer thickness of the uniform non-circumferential coating may differ from an average layer thickness of said uniform non-circumferential coating by 15% or less, preferably 10% or less, yet more preferably 5% or less, most preferably 3% or less or even better e.g. 2% or less.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable with their antonyms under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present invention, the only relevant components of the device are A and B.

Similarly, it is to be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practised without these specific details. In other instances, well-known methods, structures and techniques have not been shown in detail in order not to obscure an understanding of this description.

In a first aspect, the present invention relates to a movement system for moving a non-flat substrate across a sputter flux distribution without circumferentially exposing the non-flat substrate to said sputter flux distribution. The movement system comprises movement means for: besides a first movement of translationally transporting the non-flat substrate along the sputter flux distribution, an additional second movement of translating and/or rotating the non-flat substrate with respect to the sputter flux distribution. Herein, the first movement of translationally transporting the non-flat substrate may correspond to that part of the movement which is relatively independent of the substrate's shape; or, alternatively worded, the first movement may correspond the movement the substrate would have been subjected to had it been flat. Conversely, the second movement of translation and/or rotating is then an additional movement which typically is selected in function of the substrate's shape.

It was envisioned within the present invention that the relative change in the orientation (e.g. tilting) and/or distance (e.g. spacing) of a non-flat substrate with respect to a sputter flux distribution can also be achieved by adding an additional second movement to the substrate, rather than to the sputter system as described in WO2016005476. While the relative orientation and/or distance typically also change continuously as a substrate crosses the sputter flux distribution due to the first movement, the second movement adds the further possibility to adjust these parameters in a controlled manner, thereby allowing to account for the shape of the non-flat substrate. In doing so, the uniformity of the obtained coating can be improved, while simultaneously keeping the sputter system in a fixed position or at least reducing the movement needed to be performed thereby.

In embodiments, not circumferentially exposing the non-flat substrate to the sputter flux distribution may be due to the movement as such which the non-flat substrate is subjected to. This is in contrast to the embodiments with multiple-axis rotations in US2008152799A1 and US2017298783A9, where non-circumferential exposure is achieved not because of but despite the movement. Realizing non-circumferential exposure through the movement as such advantageously eliminates the strict need for an auxiliary structure (e.g. an adjacent substrate and/or substrate carrier) masking a portion of the surface.

Herein, translationally transporting the non-flat substrate corresponds to transporting the non-flat substrate by translating it (as e.g. typically found in a linear in-line coater). In embodiments, the first movement of translationally transporting the non-flat substrate may comprise translating a centre point (e.g. a gravitational centre point) of the substrate. In embodiments, the translational transport may be a rectilinear translation (i.e. along a straight path), curvilinear translation (i.e. along a curved path), or a sequence of one or more rectilinear and/or curvilinear translations. In embodiments, the first movement of translationally transporting may comprise (e.g. consist of) translating the non-flat substrate in a transportation direction. In embodiments, the second movement may comprise moving (e.g. translating) the non-flat substrate in a direction different from the transportation direction. In embodiments, translationally transporting the non-flat substrate may comprise translationally transporting the non-flat substrate at a substantially constant speed (i.e. the scalar magnitude of the translational transport's velocity vector may remain constant). For example, at any given point during the translational transport, the instantaneous speed may differ from the average speed by at most 20%, preferably at most 10%, more preferably at most 5%, yet more preferably at most 2%, most preferably 0%. In embodiments, translationally transporting the non-flat substrate may comprise translationally transporting the non-flat substrate at a substantially constant velocity (i.e. both the speed and direction of the translational transport's velocity vector may remain constant). For example, at any given point during the translational transport, the instantaneous speed may differ from the average speed by at most 20%, preferably at most 10%, more preferably at most 5%, yet more preferably at most 2%, most preferably 0%; and the instantaneous direction may differ from the average direction by at most 20°, preferably at most 10°, more preferably at most 5°, yet more preferably at most 2°, most preferably 0°.

In embodiments, translating the non-flat substrate with respect to the sputter flux distribution may comprise moving the non-flat substrate in a direction parallel to a centre of the sputter flux distribution (e.g. towards or away from a sputter system) and/or in a direction perpendicular thereto (e.g. towards or away from an edge of the sputter flux distribution).

In embodiments, rotating the non-flat substrate may comprise a rotation about a pivot axis or pivot point. In embodiments, rotating the non-flat substrate may comprise at least one rotation component over a rotation angle larger than 0° and smaller than 360°, preferably larger than 1° and smaller than 300°, more preferably larger than 3° and smaller than 240°, most preferably larger than 5° and smaller than 180°. Such a rotation wherein the substrate is rotated by less than a full turn is herein also referred to as 'tilting'. In embodiments, rotating the non-flat substrate may comprise a rotation component over a rotation angle of 360° or more. Such a rotation wherein the substrate is rotated by a full turn or more is herein also referred to as a 'revolving'. It will be clear that if the non-flat substrate would be rotated freely (e.g. revolved) in all directions during sputtering—and without further relying on an auxiliary structure (e.g. an adjacent substrate and/or substrate carrier) to mask a portion of the surface, the obtained coating would not be non-circumferential; which is outside the scope of the present invention. Nevertheless, it is typically possible to select one or more rotation axes about which the substrate can be revolved while still not circumferentially exposing the non-flat substrate.

When deciding on a suitable second movement, certain effects can be taken into account which are described in more detail in example 4. However, especially as the complexity of the sputter flux distribution and/or the non-flat substrate shape increase, their interplay and the effect of their relative movement can be difficult to predict accurately. Nevertheless, assuming the goal is to achieve a uniform non-circumferential coating and that a reasonable uniformity threshold is selected (which will typically depend on different factors such as the shape of the substrate, the characteristics of the sputter system, etc.), a suitable second movement can typically be found by trial-and-error or by computer simulations.

In embodiments, the non-flat substrate may comprise at least one dimension measuring 25 cm or more. In embodiments, the non-flat substrate may be a curved substrate or may comprise at least a curved portion. In embodiments, the non-flat substrate may comprise one or more flat facets. In embodiments, the non-flat substrate may comprise a polyhedral portion. In embodiments, the non-flat substrate may be convex and/or concave. In embodiments, the non-flat substrate may be a non-flat sheet. Here, a non-flat sheet substrate is considered to be a non-flat substrate comprising two major surfaces having a considerably larger area (e.g. together making up at least 70%, preferably at least 80%, yet more preferably at least 90%, of the total surface area) than other minor surfaces (e.g. borders which define the thickness of the sheet) of the substrate. The non-flat sheet substrate may be non-flat in such a way that it defines a cavity with an aperture. In such a case, to be still considered a non-flat sheet substrate, the aperture may have an area of at least 20%, preferably at least 50%, of the cavity's total inner surface area. Thus, the non-flat sheet substrate could e.g. be a dome (i.e. hemispherical or non-hemispherical, such as a cover or housing) or a shaped piece of glass (e.g. a windshield of a vehicle). Conversely, objects such as bottles or jars are not considered to be 'non-flat sheet substrates'.

Typically, one of the major surfaces is a non-flat surface which is to be coated. In embodiments, 'without circumferentially exposing the non-flat substrate to said sputter flux distribution' may be 'without substantially exposing at least one major surface of the non-flat sheet substrate to said sputter flux distribution'. In embodiments, the major surface to be coated may have an area of at least 30%, preferably at least 40%, of a total surface area of the non-flat sheet substrate.

In embodiments, the movement system may comprise a substrate carrier for holding the non-flat substrate.

In some embodiments, the movement means may be part of the substrate carrier (e.g. moving with the substrate). Such embodiments advantageously allow to relatively easily retrofit an existing coating device with the ability to subject non-flat substrates to a second movement. In other embodiments, the movement means may be external to the substrate and, if present, to the substrate carrier (e.g. being mounted inside a coating device in accordance with the second aspect). Such embodiments advantageously allow to subject non-flat substrates to a second movement without requiring every substrate and/or substrate carrier to be outfitted with movement means. In yet other embodiments, a portion of the movement means (e.g. a second member; cf. infra) may be part of the substrate carrier and another portion of the movement means (e.g. a first member, cf. infra) may be external thereto (e.g. being mounted inside a coating device in accordance with the second aspect). In embodiments, the movement means may be designed in function of characteristics of a coating device with which it is to be used. For example, the movement means may be designed in accordance with a sputter flux distribution generated by the sputter system in the coating device (e.g. a sputter flux distribution which is specific to said sputter system).

In embodiments, the movement means may comprise a guiding system for the non-flat substrate. In embodiments, the guiding system may be for generating the first movement, the second movement or both. In embodiments, the guiding system may comprise a first member (e.g. a rail, groove or a notch) and a second member (e.g. one or more protrusions, such as pins, or one or more wheels) for engaging the first member. In some embodiments the first member may be part of the substrate or substrate carrier and the second member may be external to the substrate or substrate carrier. In other embodiments the second member may be part of the substrate or substrate carrier and the first member may be external to the substrate or substrate carrier.

In embodiments, the movement means may comprise an actuator. In embodiments, the actuator may be for generating the first movement, the second movement or both. In embodiments, the actuator may be a single or multi-axis actuator. In embodiments, the one or more axes may be one or more translational and/or one or more rotational degrees of freedom. In embodiments, the actuator may be a six-axis actuator (i.e. an actuator having three translational and three rotational degrees of freedom). In embodiments, the actuator may be in communication with a control means. In embodiments, the control means may comprise a position determining means. As such, the actuator can advantageously be operated in function of the substrate's location with respect to the sputter flux distribution.

In embodiments, any feature of any embodiment of the first aspect may independently be as correspondingly described for any embodiment of any of the other aspects.

In a second aspect, the present invention relates to a coating device for non-circumferential coating of a non-flat substrate. The coating devices comprises: (i) a sputter system, comprising at least one magnetron for mounting a longitudinal sputter target, and (ii) a movement system as defined in any embodiment of the first aspect.

In preferred embodiments, the magnetron may be configured for mounting a cylindrical sputter target. In embodiments, the magnetron may be a rotating cylindrical magnetron. In other embodiments, the magnetron may be configured for mounting at least one planar (e.g. longitudinal planar) sputter target. Among potential reasons for preferring them, cylindrical sputter targets typically allow higher target utilization than planar sputter targets; nevertheless, the present invention can also work with planar sputter targets. In embodiments, the sputter system may comprise at least two magnetrons (which can also be referred to as a dual magnetron).

In embodiments, the sputter system may be configured so as to yield a selected sputter flux distribution. To this end, the sputter system may typically comprise an arbitrary number of magnetrons (and corresponding targets) with an arbitrary configuration. As such, an axis of the longitudinal sputter target (e.g. a longitudinal axis) need not to be parallel to a majority part of the non-flat substrate. The axis of the longitudinal sputter target need not to be perpendicular to the substrate transport movement. The longitudinal sputter target need not have a length which corresponds to a dimension of the non-flat substrate. The centre of the sputter flux distribution need not to be oriented perpendicular to the substrate transport movement and have a suitable ejection angle.

In embodiments, furthermore the sputter system may be configured for, in operation, adjusting (e.g. by a time-dependent perturbation) a sputter flux distribution thereof with respect to the non-flat substrate. This may for example comprise translating and/or rotating the sputter system, and/or adjusting the magnet arrangement inside the magnetron; this is e.g. described in WO2016005476 (see therein i.a. p. 10 lines 3-21 and p. 22 line 27-p. 23 line 11), which is incorporated herein by reference. Adjusting both the sputter system and the substrate with respect to one another has the advantage that the adjustment amplitude for both can be kept within certain limits. Indeed, particularly when they get longer or wider, tilting a non-flat substrate under certain angles may require an exceedingly large (e.g. high) sputter chamber to accommodate the length and/or width of the substrate. In such cases, notwithstanding any disadvantages that may be associated with adjusting the sputter system, it may nevertheless be advantageous to subject the sputter system to a relatively small adjustment (e.g. a small tilting thereof) and thereby greatly reduce the angle under which the non-flat substrate is to be tilted.

In embodiments, the coating device may be a continuous coating device. In embodiments, the coating device may be an in-line coater or a batch coater, preferably an in-line coater. An in-line coater is a coating system in which substrates are entered into and removed from without breaking the vacuum; this can for example be achieved using a load lock compartment for bringing the substrates from atmospheric pressure to vacuum level or vice versa. This is in contrast to a typical batch coater in which substrates are loaded into the coating device, the air is pumped out, the coating is performed and then the coating device is vented before unloading the substrates and repeating the process.

In embodiments, any feature of any embodiment of the second aspect may independently be as correspondingly described for any embodiment of any of the other aspects.

In a third aspect, the present invention relates to a method for non-circumferentially coating a non-flat substrate. The method comprises: (a) providing a coating device as defined in any embodiment of the second aspect, and (b) moving the non-flat substrate along the sputter system while sputtering a coating thereon; wherein the moving comprises: (b1) translationally transporting the non-flat substrate along the sputter system, and (b2) additionally translating and/or rotating the non-flat substrate with respect to the sputter system.

In embodiments, translating and/or rotating the non-flat substrate in step b2 may be in function of a shape of the non-flat substrate.

In embodiments, rotating the non-flat substrate in step b2 may comprise at least one rotation component over a rotation angle larger than 0° and smaller than 360°.

In embodiments, any feature of any embodiment of the third aspect may independently be as correspondingly described for any embodiment of any of the other aspects.

In a fourth aspect, the present invention relates to a use of a coating device according to any embodiment of the second aspect for providing a uniform coating on at least one major surface of a non-flat substrate, selectively with respect to at least one other major surface thereof. Herein is understood that the at least one major surface is uniformly coated while the at least one other major surface is substantially not coated.

In embodiments, a local layer thickness (i.e. a layer thickness which may be measured at any given location of the coating) of the uniform coating may differ from an average layer thickness of said uniform coating by 15% or less, preferably 10% or less, yet more preferably 5% or less, most preferably 3% or less, such as 2%.

In embodiments, any feature of any embodiment of the fourth aspect may independently be as correspondingly described for any embodiment of any of the other aspects.

The invention will now be described by a detailed description of several embodiments of the invention. It is clear that other embodiments of the invention can be configured according to the knowledge of the person skilled in the art without departing from the true technical teaching of the invention, the invention being limited only by the terms of the appended claims.

Figure 1:
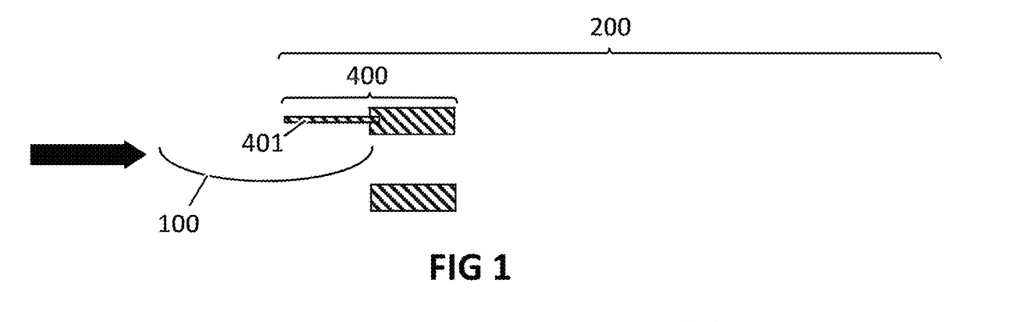
FIG. 1-FIG. 4 schematically depict the coating of a 2D curved substrate in accordance with exemplary embodiments of the present invention.
Figure 2:
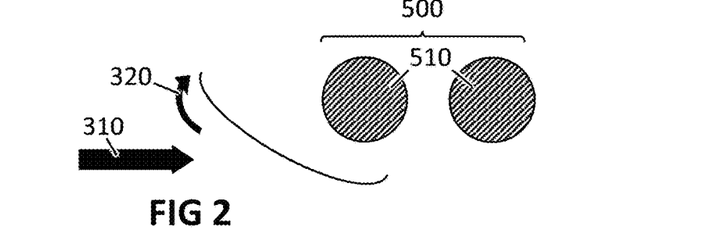
Figure 3:
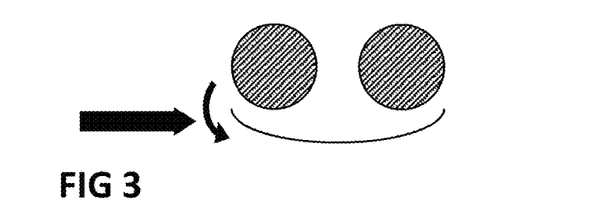
Figure 4:
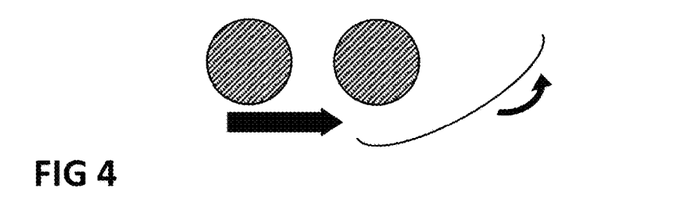

Example 1: Coating Device for Non-Circumferential Coating of a 2D Non-Flat Substrate FIG. 1-FIG. 4 schematically depict a 2D curved substrate (100) (i.e. a substrate of which the surface to be coated has a curvature in one dimension and is straight in a dimension perpendicular thereto) being coated by a coating device (200) in accordance with the present invention. The 2D curved substrate (100) is first entered into the coating device (200) through a gate valve (410) of a load lock compartment (400) (FIG. 1). The 2D curved substrate (100) is then translationally transported (310) further towards the sputter system (500), which here comprises two cylindrical sputter targets (510) mounted on a dual rotating magnetron. On top of the transportation movement (310), the 2D curved substrate (100) is also tilted (320) so that the surface to be coated faces towards the sputter system (500) when entering the coating zone (FIG. 2). As the 2D curved substrate (100) passes through the coating zone, thereby crossing the sputter system's sputter flux distribution, the orientation and/or distance of the 2D curved substrate (100) are constantly gradually adjusted by rotation (e.g. changing the tilt) and/or translation (e.g. changing the spacing) thereof (FIG. 3). The 2D curved substrate (100) eventually leaves the coating zone (FIG. 4) and may then be unloaded from the coating device (200) through an exit gate valve (not depicted). As depicted, the transportation direction (310) runs parallel with the curved dimension of the 2D curved substrate (100) and both are perpendicular to the longitudinal axis of the sputter system (500) (with parallel cylindrical sputter targets). This may be the preferred configuration for a 2D curved substrate (100) (at least in the coating zone), as it allows most easily to adjust the orientation and/or distance of the 2D curved substrate (100) with respect to the sputter flux distribution, with the aim of accounting for the substrate's shape to achieve a uniform coating on the surface to be coated. In the current example, the magnetic system of the dual rotating magnetron is not depicted. If desired or required, the magnetic system of the sputter system (500) may move or swing, preferably synchronized with the position and movement of the 2D curved substrate (100) along the coating zone.

Figure 5:
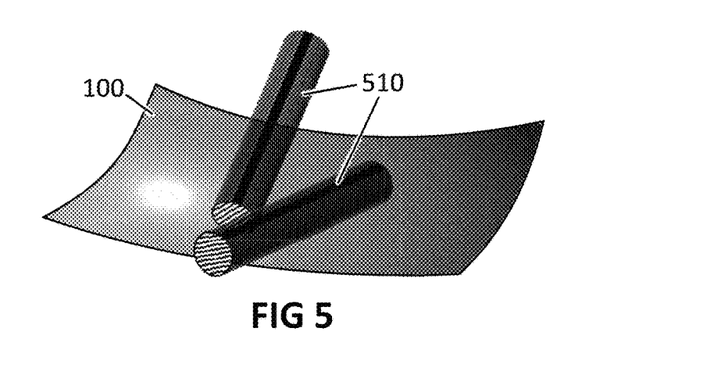
FIG. 5 schematically depict a sputter system arrangement comprising two sputter targets.

It is noted that the sputter system configuration described for FIG. 1-FIG. 4 is only exemplary, and may more generally comprise an arbitrary number, geometry and orientation of longitudinal sputter targets (510), thereby achieving some desired sputter flux distribution. This is schematically represented in FIG. 5.

Example 2: Coating Device for Non-Circumferential Coating of a 3D Non-Flat Substrate

Example 2a

Figure 6:
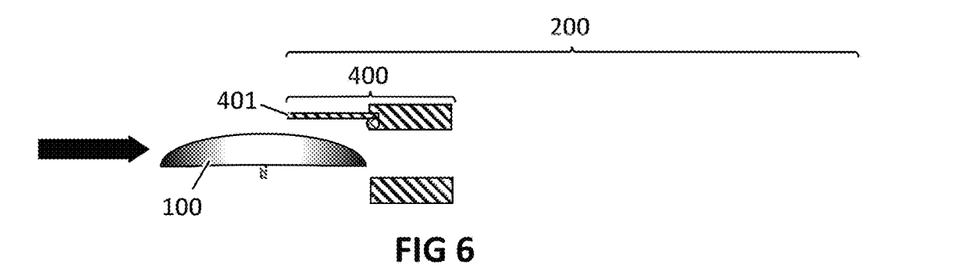
FIG. 6-FIG. 9 schematically depict the coating of a 3D curved substrate in accordance with exemplary embodiments of the present invention.
Figure 7:
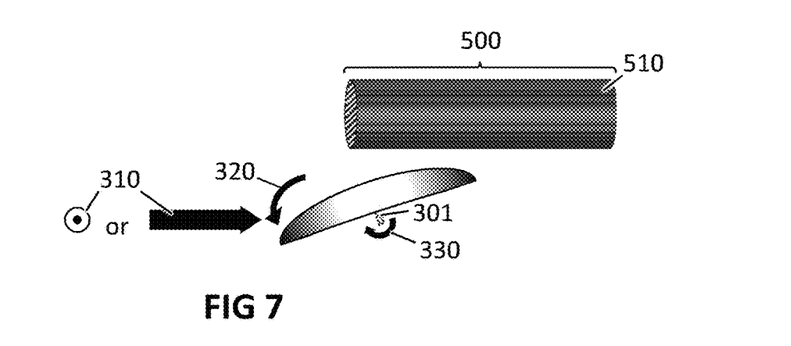
Figure 8:
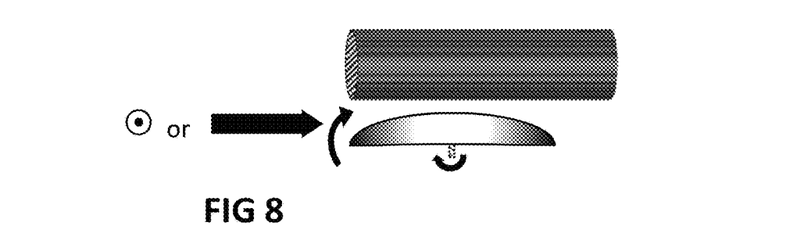
Figure 9:
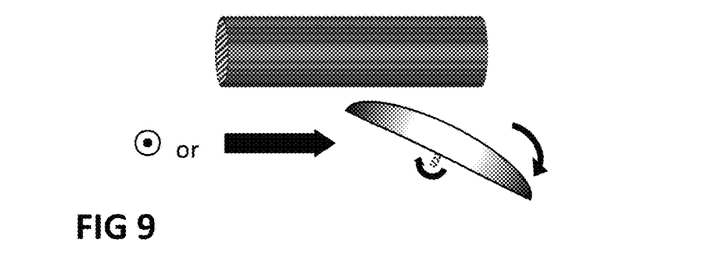
Figure 10:
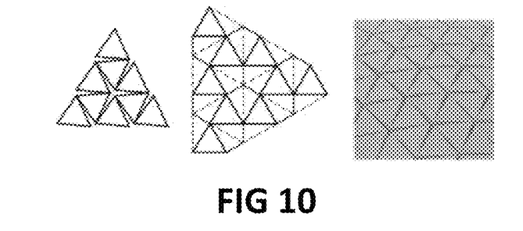
FIG. 10-FIG. 13 show different tessellations on the basis of which a deployable substrate carrier could be made.
Figure 11:
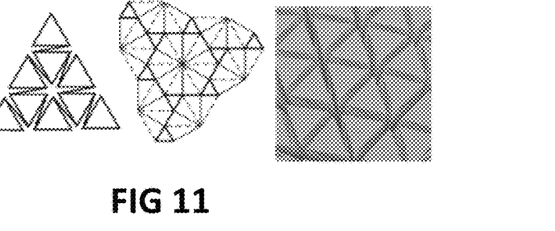
Figure 12:
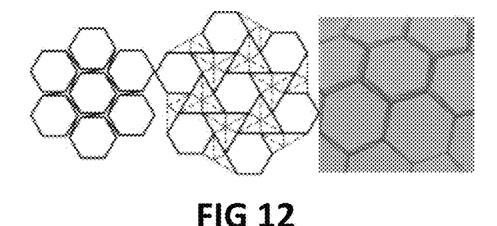
Figure 13:
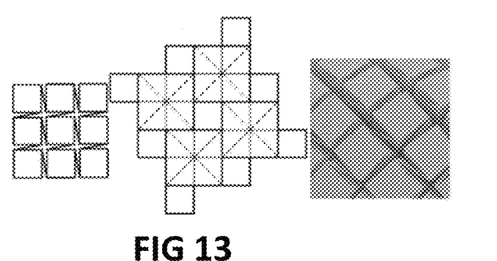

FIG. 6-FIG. 9 schematically depicts a 3D curved substrate (100) (i.e. a substrate of which the surface to be coated has a curvature in two perpendicular dimensions) being coated by a coating device (200) in accordance with the present invention. The 3D curved substrate (100) is first entered (310) into the coating device (200) through a gate valve (410) of a load lock compartment (400) (FIG. 6). The 3D curved substrate (100) is then translationally transported (310) further towards the sputter system (500), which here comprises one cylindrical sputter target mounted on a rotary magnetron. As depicted, the transportation direction (310) runs parallel with a curved dimension of the 3D substrate and both are either perpendicular or parallel to the longitudinal axis of the sputter system (500). On top of the transportation movement (310) then, the 3D curved substrate (100) is also tilted (320) so that the surface to be coated faces towards the sputter system (500) when entering the coating zone (FIG. 7). In addition to the tilting movement (320), the 3D curved substrate (100) may further optionally revolve (330) around a pivot point (301), so as to equally expose all sides of the curved surface to be coated. As the 3D curved substrate (100) passes through the coating zone, the orientation and/or distance of the 3D curved substrate (100) are constantly gradually adjusted by rotation (e.g. changing the tilt) and/or translation (e.g. changing the spacing) thereof (FIG. 8). The 3D curved substrate (100) eventually leaves the coating zone (FIG. 9) and may then be unloaded from the coating device (200) through an exit gate valve (not depicted).

Example 2b

Multiple substrates can be mounted on a substrate carrier in a packed configuration which is then made to unfold into a 3D non-flat substrate in the coating device (e.g. before and/or in the coating zone). The folding/unfolding can be by means of one or more actuators working on the substrate carrier and which can be fixed to the substrate carrier as such or to the coating device. In order to achieve a good packing and unfolding, a substrate carrier made up of jointed or hinged tessellations could be used, some examples of which are depicted in FIG. 10-FIG. 13.

Example 2c

Figure 14:
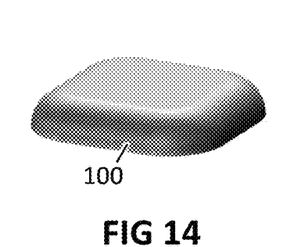
FIG. 14-FIG. 19 schematically depict a dome-shaped substrate and the coating thereof using a dual magnetron, in accordance with exemplary embodiments of the present invention.
Figure 15:
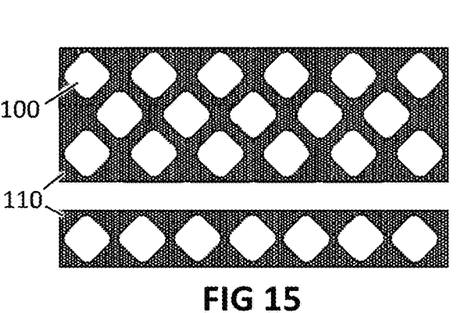
Figure 16:
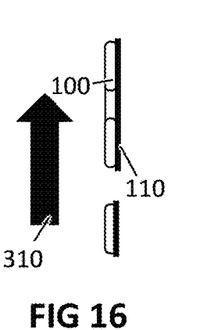
Figure 17:
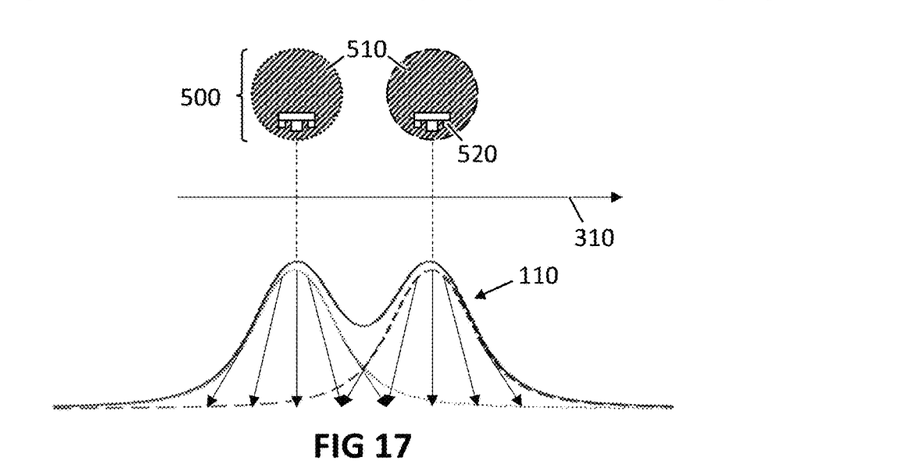
Figure 18:
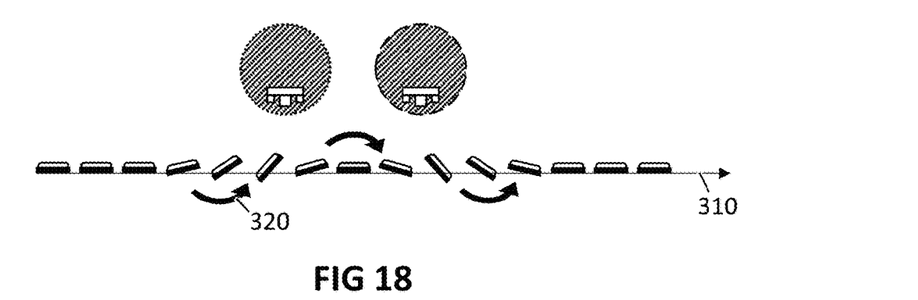
Figure 19:
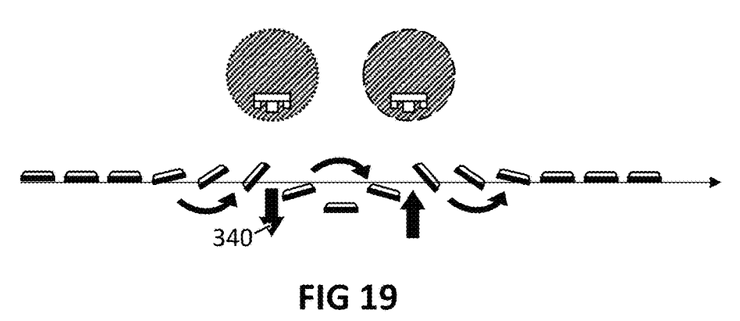

Another interesting application of the present invention is for uniformly coating the exterior of a non-flat dome-shaped substrate (100) (FIG. 14) to be used as a cover or housing. Here it is typically desired to have for all vertical exterior sides of the dome-shaped substrate (100) a coating thickness of at least 50% of that of the top exterior side, and preferably to have a comparable thickness for all exterior sides, without significantly coating the bottom or interior surface. Such substrates (100) can for example be arranged alongside one another in a single array or in multiple arrays on a substrate carrier (110); this is respectively shown at the bottom and top of FIG. 15 (top view) and FIG. 16 (side view). To coat these non-flat substrates (100), a sputter system (500) comprising a single (not shown) or two cylindrical sputter targets (510) mounted on a dual rotating magnetron (520) can be used. The corresponding expected sputter flux distribution (600) from each target (510) individually and for the sputter system (500) as a whole is shown in FIG. 17. The arrows refer to the preferential (2D) orientation of the arriving sputter flux distribution (600), while the curves indicate the (2D) intensity of the arriving sputter flux distribution (600) on a plane defined by the first movement direction. A uniform coating of the exterior of the non-flat substrates (100) can then be achieved by arranging as depicted in FIG. 15 and by translationally transporting (310) and tilting (320) the substrates (100) as depicted in FIG. 18. Moreover, an additional translation movement (340) can further be added, as shown in FIG. 19, this e.g. allows to control the thickness of the coating at the top of the non-flat surface compared to the sides thereof.

Figure 20:
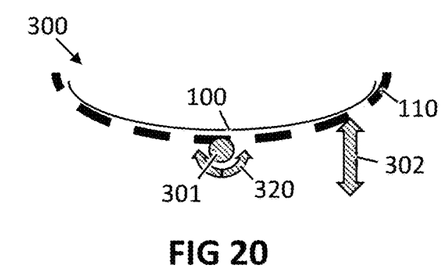
FIG. 20-FIG. 26 schematically show various movement systems in accordance with exemplary embodiments of the present invention.
Figure 21:
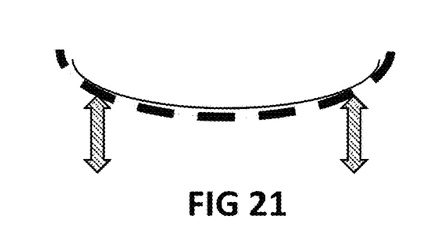
Figure 22:
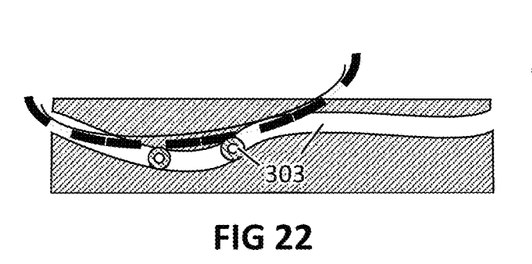
Figure 23:
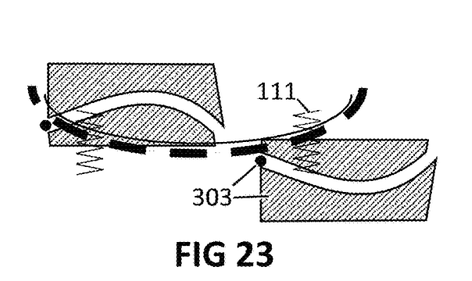

Example 3: Movement Systems for Non-Circumferential Coating of a Non-Flat Substrate A number of different ways in which the above-described additional second movements can be realized are schematically depicted in FIG. 20-FIG. 23. FIG. 20 shows a movement system (300) in which the substrate (100) is mounted on a substrate carrier (110) with a pivot (301; e.g. a pivot point or axis) and a linear actuator (302; i.e. a type of single-axis actuator). The actuator (302) allows adjusting the tilt of the substrate (100) by a rotation (320) about the pivot (301). Translation with respect to the sputter flux distribution can then optionally be effected by a further translation means (not depicted). FIG. 21 shows a movement system (300) in which the substrate (100) is mounted on a substrate carrier (110) with two linear actuators (302). By using two actuators (302), the tilt and spacing of the substrate (100) with respect to the sputter flux distribution can be adjusted simultaneously. Note that the transportation means of the movement system are not depicted in FIG. 20-FIG. 21. FIG. 22-FIG. 23 shows a movement system (300) in which the substrate (100) is mounted on a substrate carrier (110) coupled with a guiding system (303) (e.g. the substrate carrier may have protrusions or wheels engaging a rail, groove or notch of the guiding system; or vice versa). The guiding system (303) is shaped such that, on top of its transportation movement, the substrate additionally rotates and/or translates (thereby adjusting its tilt and spacing) as it crosses the sputter flux distribution. In FIG. 22 the guiding system (303) has a fixed track, entailing that the guiding system (303) will typically be specific to a particular substrate shape and will need to be exchanged when a differently shaped substrate (100) is to be coated. Conversely, in FIG. 23, the guiding system (303) comprises portions which can be moved separately, thereby allowing to adjust the guiding track to some extent and thus allowing to accommodate different substrate (100) shapes for a single guiding system (303). The substrate (100) may be suspended inside the substrate carrier (110) for pushing or pulling certain parts into the desired translational and/or rotational motion. The system may be spring-loaded (111) or the like for bringing the substrate (100) back to a homing position when no external force is exerted on it.

Figure 24:
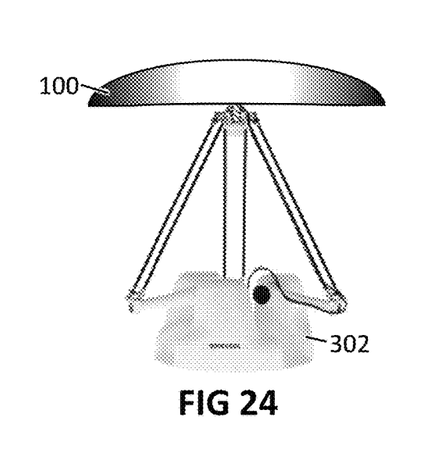

Another way in which the above-described additional movements can be realized is schematically depicted in FIG. 24, which shows a curved substrate (100) mounted on a six-axis actuator (302) (i.e. an actuator having three translational and three rotational degrees of freedom).

However, it will be clear that the movement systems (300) depicted in FIG. 20-FIG. 23 and FIG. 24 are only exemplary and that many other suitable systems can be conceived by the combination of one or more single- or multi-axis actuators (302), with or without substrate carrier (110). To give but one further example: the translation and/or rotation of the substrate could also be effected by a robotic arm adapted to grip the substrate as such or the substrate mounted on a substrate carrier.

Figure 25:
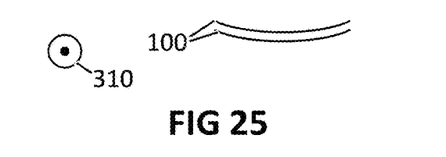
Figure 26:
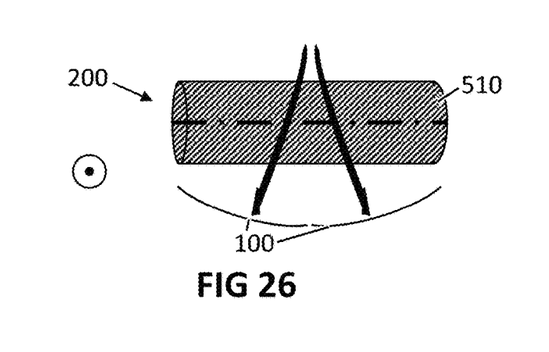

Furthermore, the movement system may be configured for deploying one or more substrates in the coating device. One example thereof has been previously described with reference to FIG. 10-FIG. 13. Another example is schematically depicted in FIG. 25-FIG. 26, where two curved substrates (100) enter the coating device (200) in a more or less stacked manner (FIG. 25), are subsequently moved alongside one another before entering the coating zone (FIG. 26) and finally could optionally be stacked again before exiting the coating device (200) (not depicted). Deploying the one or more substrate in the coating device has for instance the advantage that some parts of the coating device, such as the entrance and exit load lock compartments and their gate valves, can be made smaller, thereby facilitating maintenance of good vacuum conditions in the coating zone.

Example 4: Selecting an Appropriate Second Movement

Example 4a: Substrate has a Cylindrical Curvature with an Axis Parallel to the Longitudinal Sputter System Adjusting the spacing between magnetron and substrate: Since we know that in a first order approximation, the thickness on a 2D substrate from a longitudinal magnetron is about inversely proportional with the spacing between both; we may incorporate a translational movement to the substrate as to keep the spacing between its part most intensively exposed to the magnetron system relatively constant to the magnetron.

Adjusting the tilting of the substrate: Since we know that in a first order approximation, the thickness on a 2D substrate from a longitudinal magnetron is about linear proportional to the cosine formed between the normal on the substrate and the vector pointing to the magnetron system; we may incorporate a pivoting movement to the substrate as to keep the angle between the normal of the most intensively exposed part of the substrate and magnetron orientation relatively constant.

Example 4b: Substrate has a Cylindrical Curvature with an Axis Perpendicular to the Longitudinal Magnetron Adjusting the position of the substrate vs the magnetron end zones: Since we know that on the one hand the deposition rate in the end zones of a longitudinal magnetron is lower and on the other hand that the deposition rate on a substrate closer to the magnetron is higher; we may balance both effects by bringing the substrate closer to the magnetron edge for the zones on the substrate that are closer to the magnetron.

Adjusting the tilting of the substrate: Bringing some parts of the substrate that are closer the magnetron system (substrate geometry) closer to the magnetron edge (additional movement) as to compensate thickness non-uniformities; may pose problems for other part of the substrate that are closer to the magnetron system and that cannot be brought closer to the magnetron edge. This may be compensated by introducing an additional pivoting movement to the substrate; e.g. rotational or tilting as to balance the thickness on these other parts of the substrate.

It is to be understood that although preferred embodiments, specific constructions and configurations, as well as materials, have been discussed herein for devices according to the present invention, various changes or modifications in form and detail may be made without departing from the scope and technical teachings of this invention. For example, any formulas given above are merely representative of procedures that may be used. Functionality may be added or deleted from the block diagrams and operations may be interchanged among functional blocks. Steps may be added or deleted to methods described within the scope of the present invention.

The invention claimed is:

1. A movement system for moving a non-flat substrate from a load lock compartment across a sputter flux distribution without circumferentially exposing the non-flat substrate to said sputter flux distribution, comprising movement means for:
   a first movement of translationally transporting the non-flat substrate from the load lock compartment along the sputter flux distribution, and
   an additional second movement of translating and/or rotating the non-flat substrate with respect to the sputter flux distribution.

2. The movement system according to claim 1, wherein the movement system comprises a substrate carrier for holding the non-flat substrate.

3. The movement system according to claim 1, wherein the movement means comprise a guiding system for the non-flat substrate, the guiding system comprising:
   a first member and
   a second member for engaging the first member.

4. The movement system according to claim 1, wherein the movement means comprise an actuator.

5. The movement system according to claim 4, wherein the actuator is a multi-axis actuator.

6. The movement system according to claim 1, for moving a non-flat sheet substrate along the sputter flux distribution without exposing at least one major surface of the non-flat sheet substrate to said sputter flux distribution.

7. A coating device for non-circumferential coating of a non- flat substrate, comprising:
   (i) a sputter system, comprising at least one magnetron for mounting a longitudinal sputter target, and
   (ii) a movement system as defined in claim 1.

8. The coating device according to claim 7, wherein the magnetron is configured for mounting a cylindrical sputter target.

9. The coating device according to claim 7, wherein the sputter system comprises at least two magnetrons.

10. The coating device according to claim 7, wherein furthermore the sputter system is configured for, in operation, adjusting a sputter flux distribution thereof with respect to the non-flat substrate.

11. The coating device according to claim 1, being a continuous or in-line coating device.

12. A method for non-circumferentially coating a non-flat substrate, comprising:
   (a) providing a coating device as defined in claim 7, and
   (b) moving the non-flat substrate along the sputter system while sputtering a coating thereon;
   wherein the moving comprises:
   (b1) translationally transporting the non-flat substrate from the load lock compartment along the sputter system, and
   (b2) additionally translating and/or rotating the non-flat substrate with respect to the sputter system.

13. The method according to claim 12, wherein rotating the non-flat substrate in step b2 comprises at least one rotation component over a rotation angle larger than 0° and smaller than 360°.

14. Use of a coating device according to claim 7 for providing a uniform coating on at least one major surface of a non-flat substrate, selectively with respect to at least one other major surface thereof.

15. The use according to claim 14, wherein a local layer thickness of the uniform coating differs from an average layer thickness of said uniform coating by 15% or less.

16. The movement system according to claim 1, wherein the movement system is configured for exposing the non-flat substrate to the sputter flux distribution to provide a uniform coating on at least one major surface of the non-flat substrate, selectively with respect to at least one other major surface thereof, such that a local layer thickness of the uniform coating differs from an average layer thickness of said uniform coating by 15% or less.

17. The method according to claim 12, wherein non-circumferentially coating the non-flat substrate comprises providing a uniform coating on at least one major surface of the non-flat substrate, selectively with respect to at least one other major surface thereof, such that a local layer thickness of the uniform coating differs from an average layer thickness of said uniform coating by 15% or less.

* * * * *